United States Patent [19]
Statovici et al.

[11] Patent Number: 6,124,724
[45] Date of Patent: Sep. 26, 2000

[54] METHOD OF INCREASING AC TESTING ACCURACY THROUGH LINEAR EXTRAPOLATION

[75] Inventors: Mihai G. Statovici, San Jose; Ronald J. Mack, Gilroy, both of Calif.

[73] Assignee: Xilinx, Inc., San Jose, Calif.

[21] Appl. No.: 09/085,983

[22] Filed: May 27, 1998

[51] Int. Cl.$^7$ .................................................. G01R 31/26
[52] U.S. Cl. ...................................... 324/765; 324/158.1
[58] Field of Search ................................ 324/158.1, 765; 702/109; 714/55, 707, 724, 731, 742, 744, 745

[56] References Cited

U.S. PATENT DOCUMENTS

| | | | |
|---|---|---|---|
| 5,617,325 | 4/1997 | Schaefer | 364/488 |
| 5,923,676 | 7/1999 | Sunter et al. | 371/22.5 |

*Primary Examiner*—Safet Metjahic
*Assistant Examiner*—Russell M. Kobert

*Attorney, Agent, or Firm*—Adam H. Tachner, Esq.; Crosby, Heafey, Roach & May; Lois D. Cartier

[57] ABSTRACT

A method and system are provided for increasing the accuracy of AC parametric testing. The invention provides a method of precisely estimating signal propagation delay time in an integrated circuit testing apparatus, wherein a plurality of signal propagation delay time measurements are taken and additional delay times are estimated by linearly interpolating the measured delays. A desired test point (desired output voltage at a given time) is established. Using a sample device, a slope is established on a time vs. voltage plot for a line through the desired test point. Where a desired test point falls between strobe times on a tester, linear extrapolation is used to calculate what voltages must be tested for at the two bracketing strobe times in order to guarantee the desired performance at the desired test point. One or more devices are then tested for the calculated voltages at the corresponding bracketing strobe times.

3 Claims, 9 Drawing Sheets

```
100: ......  .  .  .  . .  . . . . . .******             50
101: ......  .  .  . . .  . . . . . .******
102: ......  .  .  . . .  . . . . . .******
103: ......  .  .  . . .  . . . . . .******
104: ......  .  .  . . .  . . . . . .******
105: ......  .  .  . . .  . . . ************
106: ......  .  .  . . .  . ************
107: ......  .  .  . . .  ************
108: ......  .  .  . . . ************
109: ......  .  .  . * *.************
110: ......  .  .  . ooooooooooooooooo
111: ......  .  .  .****************
112: ......  .  .  ****************
113: ......  .  ..****************
114: ........ * .*****************
115: ......  .  .*****************
116: ......**** *****************
117: ......**********************
118: ......**********************
119: ......**********************
120: ......**********************
```
FIG. 5A

```
100: ......  .  .  . . .  . . . . .******        51
101: ......  .  .  . . .  . . . . .******
102: ......  .  .  . . .  . . . . .******
103: ......  .  .  . . .  . . . . .******
104: ......  .  .  . . .  . . . . .******
105: ......  .  .  . . .  . . ************
106: ......  .  .  . . .  ************
107: ......  .  .  . . . ************
108: ......  .  .  . . ************
109: ......  .  .  . .***************
110: ......  .  .  . ooooooooooooooooo
111: ......  .  .  ****************
112: ......  .  . ****************
113: ......  .  .****************
114: ......  . .*****************
115: ......  . .*****************
116: ......  .*********************
117: ......**********************
118: ......**********************
119: ......**********************
120: ......**********************
```
FIG. 5B

```
100: ......  .  .  . . .  . . . . . .******     52
101: ......  .  .  . . .  . . . . . .*******
102: ......  .  .  . . .  . . . . . *******
103: ......  .  .  . . .  . . . . .********
104: ......  .  .  . . .  . . . . *********
105: ......  .  .  . . .  . . . **********
106: ......  .  .  . . .  . . ***********
107: ......  .  .  . . .  . ************
108: ......  .  .  . . .  .************
109: ......  .  .  . . . **************
110: ......  .  .  . . ooooooooooooooooo
111: ......  .  .  . .****************
112: ......  .  .  .*****************
113: ......  .  .  *****************
114: ......  .  . *****************
115: ......  . .******************
116: ......  . .*******************
117: ......  . .********************
118: ......  . *********************
119: ......  .**********************
120: ......**********************
```
FIG. 5C

METHOD OF INCREASING AC TESTING ACCURACY THROUGH LINEAR EXTRAPOLATION

FIELD OF THE INVENTION

The present invention is related generally to integrated circuit testers, and more specifically to testing AC functional characteristics, particularly propagation delay times, of high speed integrated circuit devices.

BACKGROUND OF THE INVENTION

A circuit tester applies digital signal patterns called test vectors to the electrical connections (pads or pins) of a device under test ("DUT"). A schematic diagram of an available tester is provided in FIG. 1. Tester 1 comprises a central processing unit ("CPU") 10 connected to external elements such as terminal 11, printer 12, and port 13 for establishing a link with other apparatus such as a communication link with a host computer. CPU 10 is also connected to bus 14 for transmitting and receiving data to and from various tester elements.

The DUT is connected to the tester through a contactor socket (not shown) and a load board 15. The input/output connections of the socket normally correspond to the pins of the device to be tested, each pin being connected to a specific card referred to as an electronic pin 16 (only one of which is shown in FIG. 1) which constitute in plurality a set of boards, arranged generally as a ring. Pins 16 comprise a bidirectional link with a test vector memory 17 and a specific link with a terminal of load board 15. Pins 16 also provide access to common circuits for providing reference voltages 19 and time delays 19' via general bus 14. Each electronic pin 16 comprises amplitude and time shaping circuits for adjusting the signals received from memory 17 to match the references provided by circuits 19 and 19'. Load board 15 may comprise buffer impedances and read relays for connecting the integrated circuit pins of the DUT either to an electronic pin 16 or to central measuring unit (CMU) 18 which applies and measures currents and voltages.

As integrated circuit devices become faster, the propagation delay (TPD) through a device (e.g., from an input pin to an output pin) must be more precisely measured to ensure accurate verification of device operation. Referring to FIG. 2, TPD can be defined as the length of time that passes from point B in the timing diagram for signal $DUT_{IN}$, to point C in the timing diagram for signal $DUT_{OUT}$. Since the specifications for an especially fast device might call for a very small TPD (e.g., 5 nanoseconds), and the propagation delay of the path through the testing apparatus itself (tester delay from point A to point B in FIG. 2) may be comparable to the TPD of the device (e.g., 8 nanoseconds), the tester delay must be accurately measured and accounted for to properly measure TPD at a fine scale. Too much error in tester propagation delay measurement leads to unreliable TPD measurement, thereby potentially decreasing the number of verified-TPD high-speed devices yielded after testing. Also, it is critical to place points B and C at the appropriate point in a rising or falling skew line, to ensure accurate pass/fail measurements during testing.

Referring next to FIG. 3, it is presently known to use comparator circuit 20 to measure tester propagation delay through a tester signal path (between the pin electronics within the test head (not shown), through connections 44 to the load board 15, contactor 40, and DUT 42 ) using a technique commonly referred to as Time Domain Reflectometry (TDR). In a TDR measurement, a step waveform signal is sent through a test channel from driver 30 in the test head to a high impedance load (e.g., the open socket) in load board 15. The signal reflects from the open socket and returns to its source. The elapsed time is measured when the reflected waveform returns to its source, and the tester path delay is half the measured elapsed time.

While TDR can provide valuable delay information, its accuracy is limited by the specifications of comparator circuit 20, which is illustrated in detail in FIG. 4. In comparator circuit 20, digital to analog converter (DAC) 24 provides a reference voltage $V_{OL}$ for comparison to driver-supplied input signal $V_{OUT}$ by comparator 26. Driver-supplied input signal $V_{OUT}$ is provided by driver 30 in FIG. 3. The output of comparator 26 is then forwarded to logic comparator 22. Each time logic comparator 22 receives an activation signal from strobe 28, logic comparator 22 provides either a logic high or logic low signal depending upon the output of comparator 26. Strobe 28 is activated at a precisely known time, thereby accurately indicating the logic level of the signal forwarded by comparator 26.

There are two variables that determine the accuracy of comparator circuit 20: the step size (also known as comparator voltage resolution) of the test stimulus digital signal received by DAC 24, and the precise timing of the strobe signal received from strobe 28. Strobe resolution is often the limiting factor in testing error. While strobe resolution is limited to about a 0.1 nanosecond step (100 picoseconds, two percent of a 5 nanosecond delay), presently available reference voltage resolution (generated by DAC 24 and forwarded to comparator 26 in FIG. 4) is generally about a 2.5 millivolt step for a 0 to 3 volt signal (only about 0.08 percent error from coarse resolution). In device lots having a TPD standard deviation of 100 picoseconds or less, the error created by the coarse resolution of strobe signals is therefore significant and can lead to costly reductions in yield. Therefore, there is a need in the integrated circuit testing field for a method of increasing the effective resolution of test strobe signals.

SUMMARY OF THE INVENTION

A method and system are provided for increasing the accuracy of AC parametric testing. The invention provides for the derivation of highly accurate response characteristics through linear interpolation and extrapolation. The invention further allows for the utilization of test signals having almost any discrete time value and voltage magnitude by modifying the input signals and output testing points according to extrapolated voltage and timing values, thereby substantially reducing measurement error, increasing test efficacy, and boosting high-speed device yield.

The invention provides a method of precisely estimating tester delays (signal propagation delay time in an integrated circuit testing apparatus), wherein a plurality of tester delay measurements are taken and additional delays are estimated by linearly interpolating the measured delays.

The invention also provides a method of precisely estimating propagation delays through a device via linear extrapolation. A desired test point (desired output voltage at a given time) is established. Using a sample device, output voltage measurements are taken at a plurality of strobe times. Using these voltage measurements, a slope is established on a time vs. voltage plot for the sample device. This slope is then applied to a line through the desired test point. Where a desired test point falls between strobe times on a tester, linear extrapolation from the desired test point is used to calculate what voltages must be tested for at the two bracketing strobe times in order to guarantee the desired performance at the desired test point. One or more devices are then tested for the calculated voltages at the corresponding bracketing strobe times. If a device passes both tests, it may be assumed (to a desired level of accuracy) that the device would pass the test at the desired test point, if it were possible to make such a test.

Two test points bracketing the desired test point may be used, as previously described. This method provides a relatively high degree of accuracy, even where a DUT has a response curve with a slightly different slope than the sample device. In an embodiment requiring less accuracy only one test point is used. In another embodiment, two test points not bracketing the desired test point are used.

BRIEF DESCRIPTION OF THE DRAWINGS

The present invention is illustrated by way of example, and not by way of limitation, in the following figures, in which like reference numerals refer to similar elements.

FIGS. 5A–5C illustrate the evolution of tester delay data compiled using the method of the present invention and TDR.

DETAILED DESCRIPTION OF THE DRAWINGS

Figure 4:
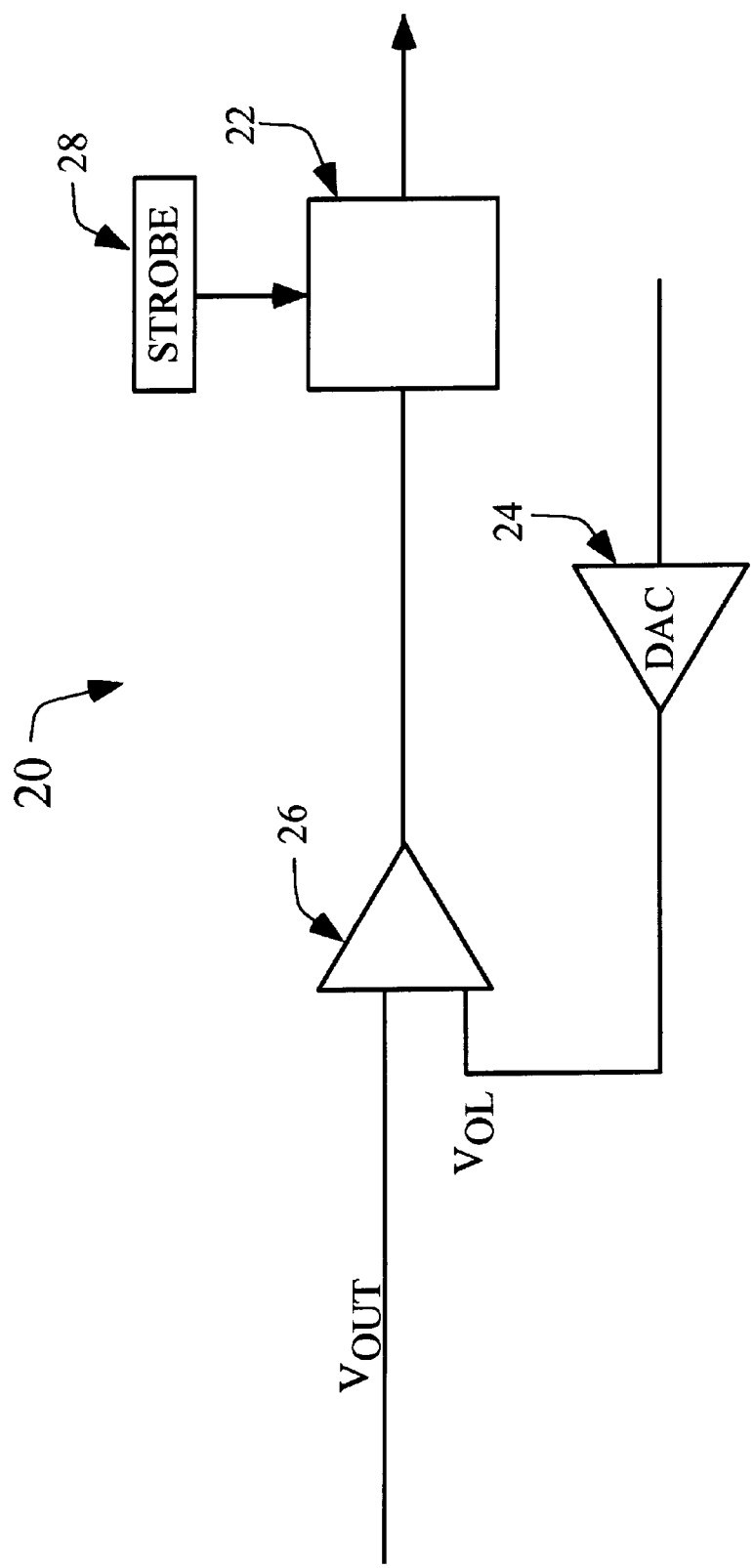
FIG. 4 illustrates a circuit for measuring the propagation delay inherent in the circuit of FIG. 3.

Using TDR, one may obtain response data such as those found in matrix 50 of FIG. 5A, wherein the y-axis represents test voltage levels 100–120 and the x-axis represents strobe timing signals, each timing slot representing a 20 picosecond step. The response data in FIGS. 5A–5C represents tester delay data. Each dot in matrix 50 represents a failed test, while each asterisk represents a passed test. Line 110 provides the pass/fail results for the target voltage of the intended measurement. In line 110, a circle represents a passed test. The stair-shaped pass/fail edge running diagonally across matrix 50 represents the closest measure of tester delay time (using presently available techniques) for each voltage level. Since actual tester delay over a range of voltage levels should be linear, the staggered, stair-like nature of the pass/fail edge in matrix 50 of FIG. 5A results from the error induced by the coarse timing characteristics of strobe source 28 (FIG. 4).

According to one embodiment of the present invention, matrix 50 of FIG. 5A is "smoothed out" as shown in matrix 51 of FIG. 5B. The asterisks indicating passed tests are shifted right and the dots indicating failed tests are shifted left, so that the graph indicates a continuous region of passed tests. For example, at row 114, the first asterisk is shifted one timing point (i.e., 20 picoseconds) to the right to compensate for the fail point to the right of the first pass point.

Next, as illustrated in FIG. 5C, the linear interpolation 52 of the stair edge points in matrix 51 of FIG. 5B is calculated using an available linear interpolation model such as that provided by using the fitted straight line equation y=a+bx. In this equation, "y" is the test voltage and "x" is the time. The values of "a" and "b" are calculated using a series of "i" sample points, where "i" is an integer. Variable "a" is $y_{AVE}$, the average voltage of a plurality of sample points $y_i$. The slope b is calculated using the equation:

$$b = \frac{\sum_i [(x_i - x_{AVE})(y_i - y_{AVE})]}{\sum_i (x_i - x_{AVE})^2}$$

where $x_{AVE}$ is the average time over the set of "i" sample points.

The linearly interpolated values illustrated in matrix 52 of FIG. 5C provide an accurate measure of the actual delay values for the tester. Therefore, since a very close measure of test channel length and delay is provided, the interpolated TDR data (i.e., the tester delay) is preferably utilized by subtracting the calculated tester delay from the measured $DUT_{IN}$ timing value, and by adding the calculated tester delay to the measured $DUT_{OUT}$ timing value during testing.

After the tester delay for each of the tester channels is measured with TDR and interpolated, it is necessary to test the TPD of each device signal path. It should be noted, however, that the disclosed TDR method of the present invention is not required, but rather preferred, for increasing the accuracy of the novel method for measuring TPD discussed below.

Figure 6:
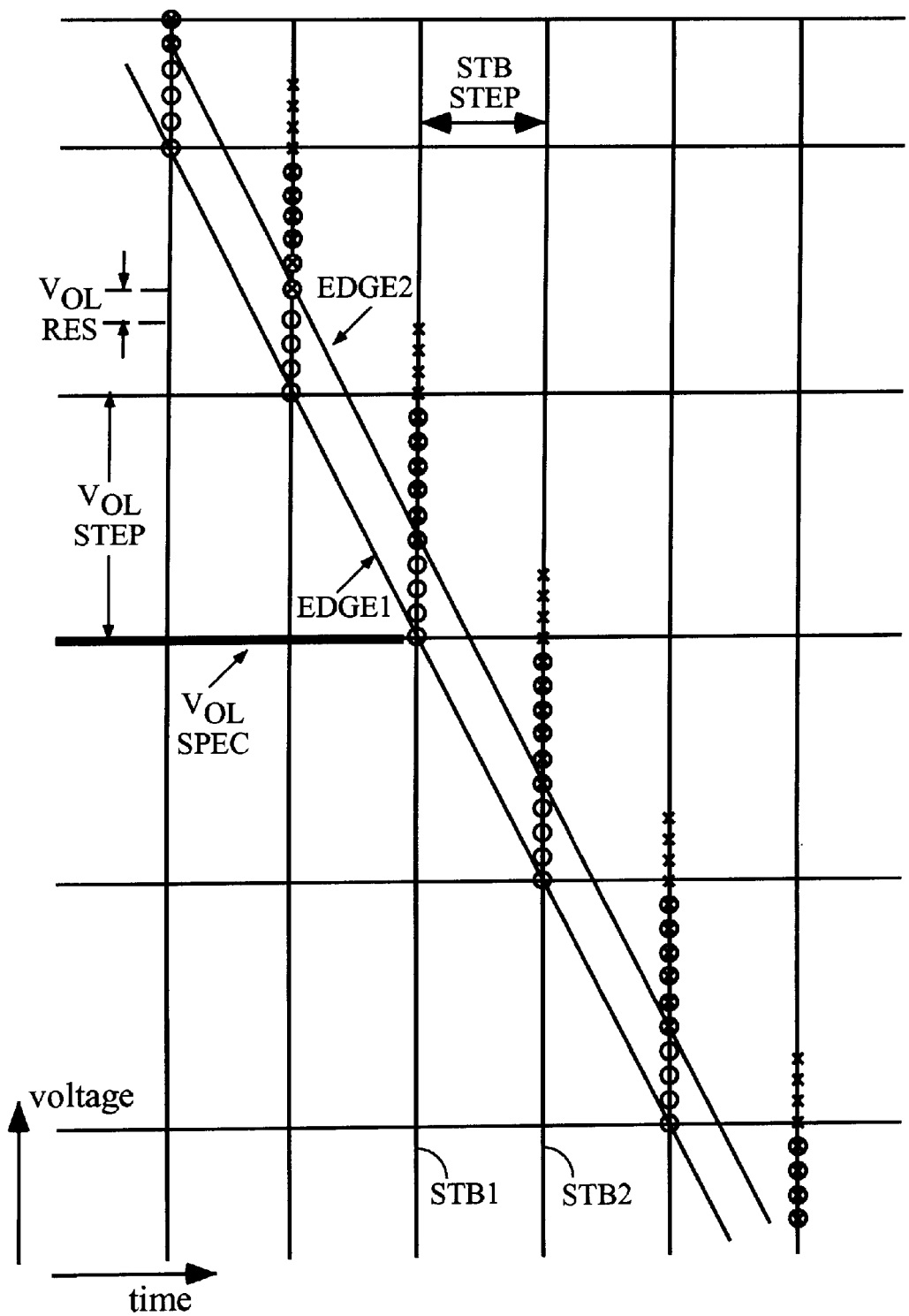
FIG. 6 is a graphical representation of a plurality of data points similar to those found in FIGS. 5A–5C, but measuring TPD instead of tester delay.

Referring to FIG. 6, the vertical axis represents reference voltage $V_{OL}$, with the specified output voltage level labeled as $V_{OLSPEC}$. The horizontal axis represents elapsed time, with a strobe resolution of $STB_{STEP}$. In FIG. 6, two exemplary output edges representing data from two different test devices are illustrated. For Edge1, the passing data points are represented as circles. For Edge2, the passing data points are represented as "X"s. (In many cases the circles and "X"s overlap.) Edge1 passes through the intersection of the $V_{OLSPEC}$ line and a strobe step line (STB1). Therefore, the device represented by Edge1 can easily be verified as passing at strobe line STB1 using available methods. However, the intersection of Edge2 and $V_{OLSPEC}$ does not correspond to any strobe line, and the proper function of a device providing data corresponding to Edge2 cannot be adequately verified using available testing methods. Using available methods, Edge2 is simply reported as passing at the next higher strobe line (STB1 plus $STB_{STEP}$, or STB2). The device represented by Edge2 is therefore reported to have poorer performance than it actually displays.

However, using the method of the present invention to calculate the appropriate $V_{OL}$ for Edge2, the slope is derived through the linear interpolation technique described above in relation to derivation of improved TDR measurements. Then, since the tests are limited to fairly coarse-grained strobe steps, tests for $V_{OL}$ can be shifted up or down Edge2 (i.e., can be performed at test points above or below the desired test point) to be accurately verified for proper function. Using this technique, a testing procedure can accurately verify the actual performance of a device.

Figure 7:
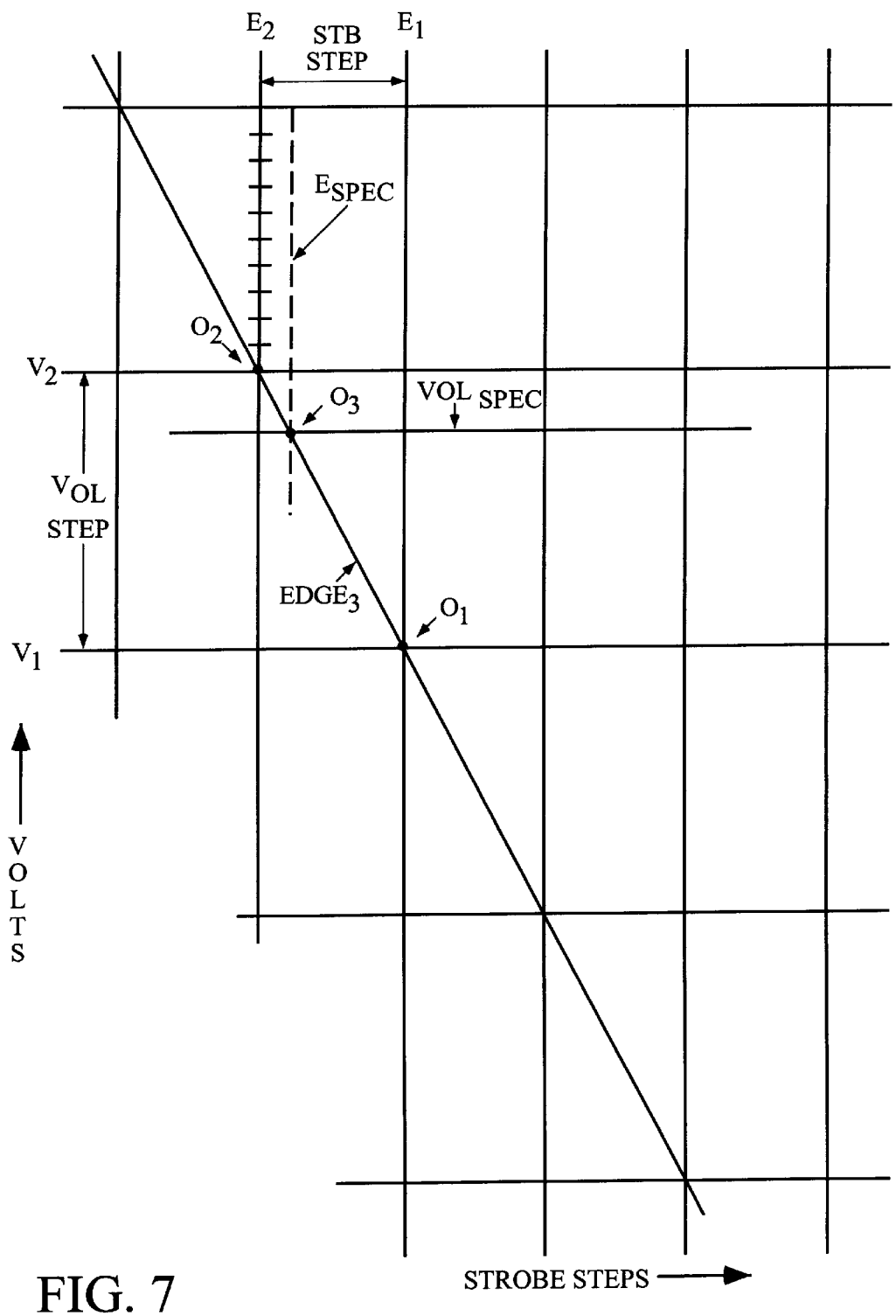
FIG. 7 illustrates the linear extrapolation and voltage shift functions of the method of the present invention.

Referring to the specific example illustrated in FIG. 7, a specified $V_{OLSPEC}$ intersects Edge3 at a test point $O_3$. However, since test point $O_3$ is not aligned with any strobe line, the test point must be shifted to either point $O_2$ along strobe line $E_2$ or point $O_1$ along strobe line $E_1$. To properly execute the shift, a calculation is made based upon the proportionality of two right triangles, the first triangle having a first hypotenuse between $O_1$ and $O_2$, and the second triangle having a second hypotenuse between $O_2$ and $O_3$. To move the test point to point $O_2$, the output voltage at point $O_2$, $V_2$, is derived from the equation:

$$V_2 = V_{OLSPEC} + b(E_2 - E_{SPEC})$$

where b represents the known slope of Edge3 and $E_{SPEC}$ is the specified strobe point at which output voltage $V_{OLSPEC}$ must be present in a passing device. Similarly, to move the test point to point $O_1$, the output voltage at point $O_1$, $V_1$, can be derived from the following equation.

$$V_1 = V_2 + b(STB_{STEP})$$

For example, if point $O_3$ is 25% of the way from $E_2$ to $E_1$ (that is, removed a distance 0.25 ($STB_{STEP}$) from $E_2$), then $$V_2 = V_{OLSPEC} + 0.25(V_{OLSTEP})$$

and $$V_1 = V_{OLSPEC} - 0.75(V_{OLSTEP})$$

where $V_{OLSTEP}$ equals the absolute value of $b(STB_{STEP})$ and b is the Edge3 slope calculated from the linear interpolation equations discussed above.

Therefore, in one embodiment of the present invention tester propagation delay is first (though optionally) measured and linearly interpolated. The desired test point (i.e., time and desired output voltage for a given test) is calculated based on the specification, tester propagation delay, and desired guardbanding. ("Guardbanding" is the practice of testing a parameter at a tighter value than the specified value, to guarantee the specified value while taking the test system accuracy into consideration.) Next, after a sample TPD test is executed at a first time and voltage for a first device, a variety of results taken around this first test point are collected. After linearly interpolating this data and deriving a slope of the interpolated pass/fail edge line, the measured slope is applied to a line through the desired test point. This line is utilized via linear extrapolation to find the test points on the two strobe lines bracketing the desired time and voltage. In one embodiment, TPD is then verified twice, once at each of the two test points, passing measurements being required in both instances. If both tests are passed, it is safe (within a certain level of accuracy) to assume that the device would have passed at the desired test point as well. In another embodiment, where a lower level of accuracy is acceptable, only one of the two bracketing test points is used.

Figure 1:
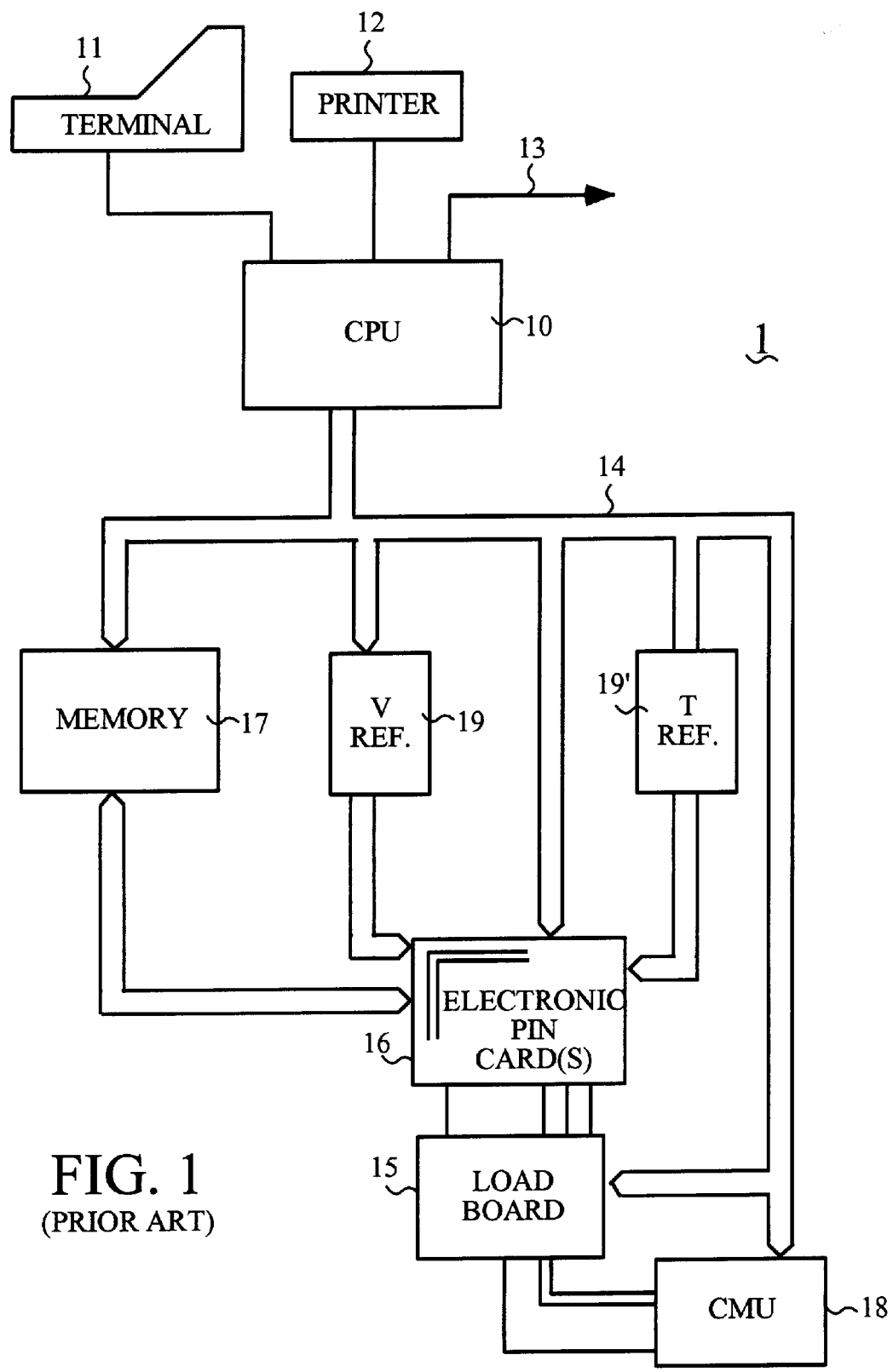
FIG. 1 illustrates a prior art testing apparatus.
Figure 2:
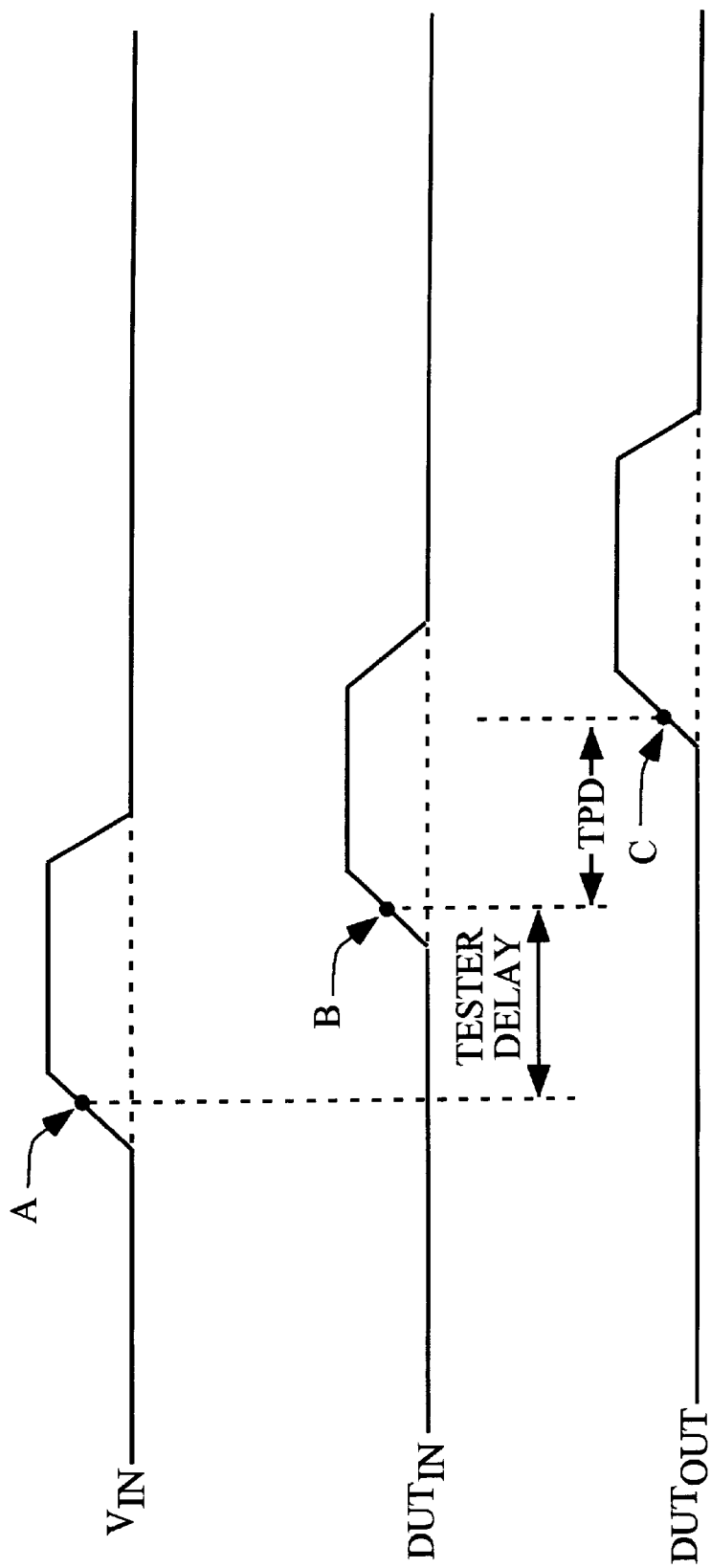
FIG. 2 illustrates the total propagation delay of a device under test and propagation delay of a tester apparatus.
Figure 3:
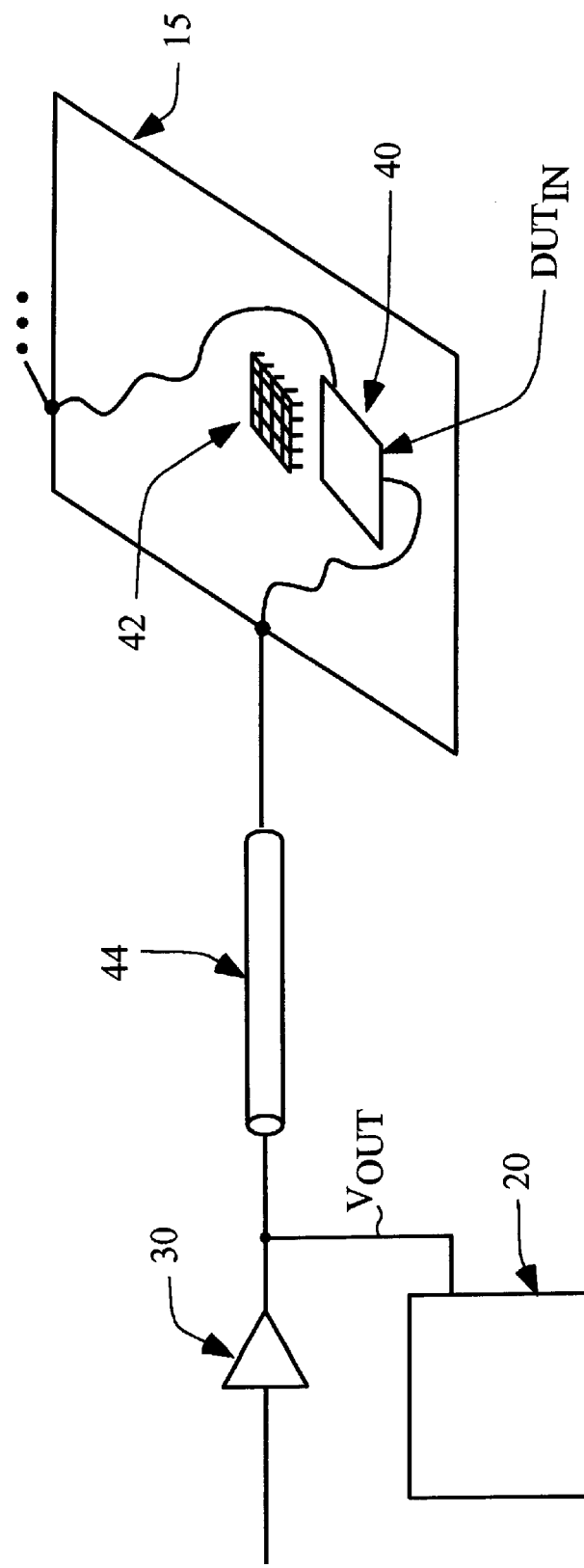
FIG. 3 illustrates the signal path through a testing apparatus test channel.
Figure 8:
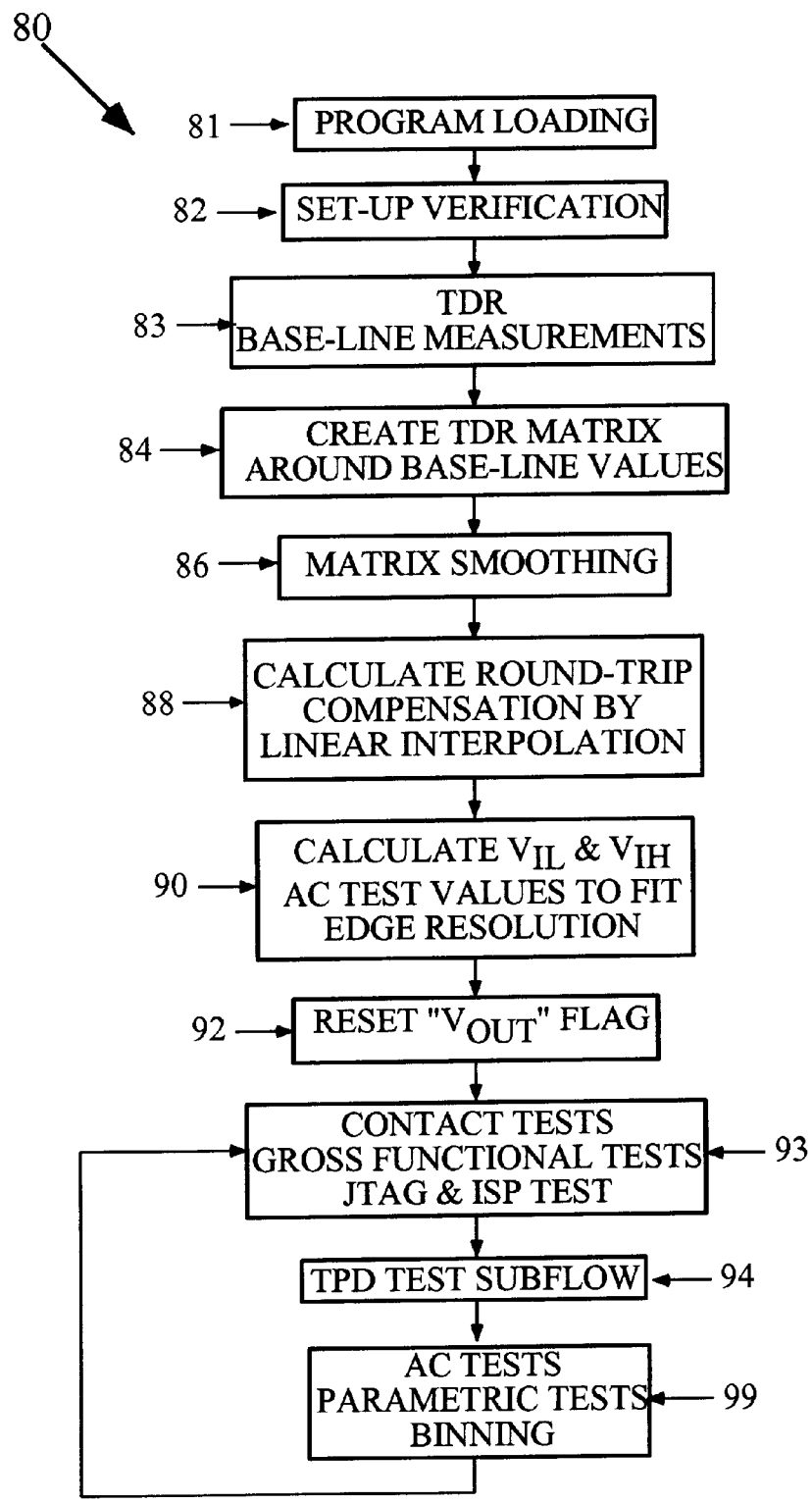
FIGS. 8 and 9 provide, in combination, a flowchart illustrating one embodiment of the method of the present invention.
Figure 9:
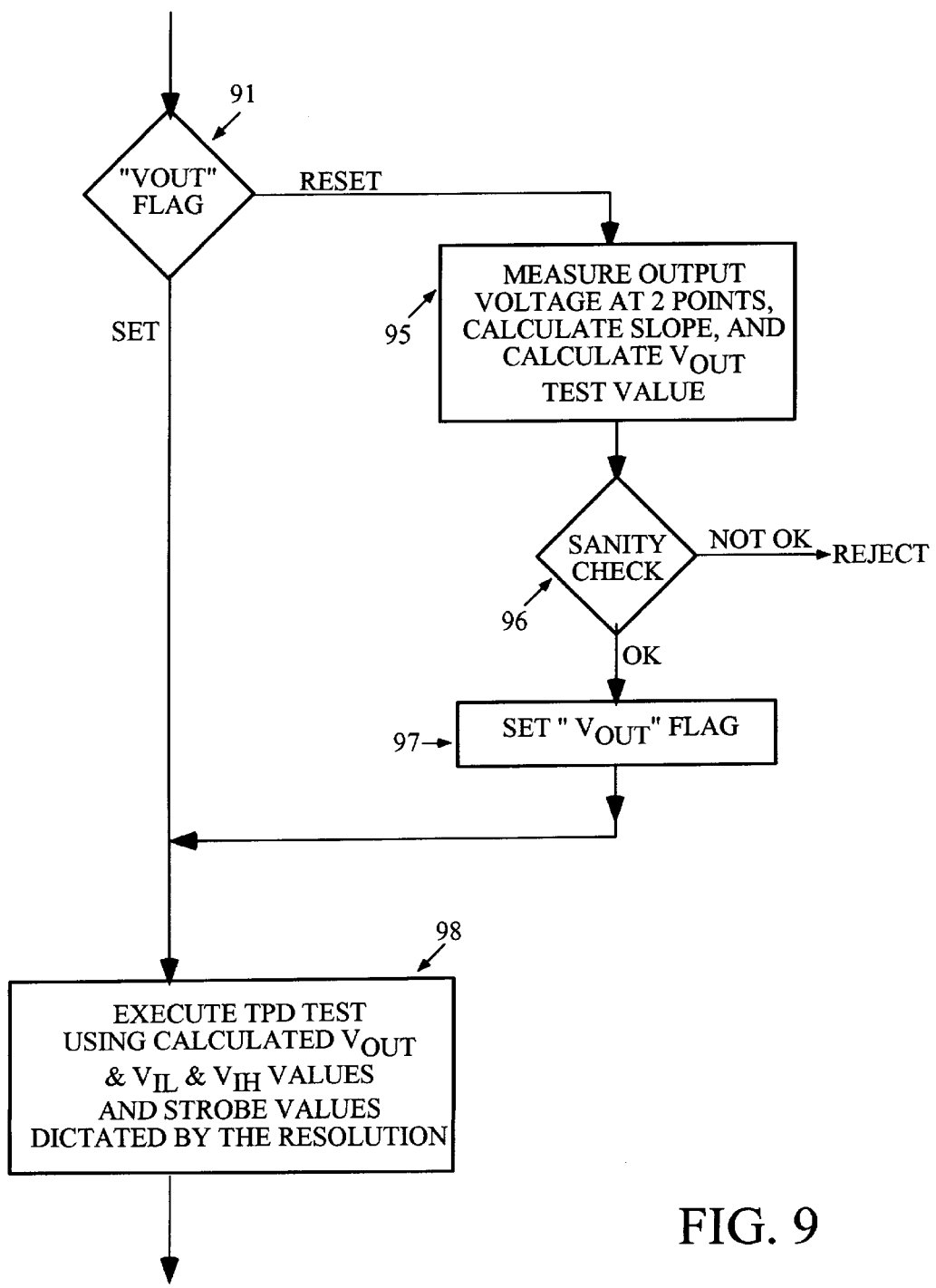

The flowchart of FIGS. 8 and 9 illustrates the steps 80 of one embodiment of the testing method of the present invention. Beginning at step 81, a test program is loaded into a test apparatus similar to that illustrated in FIG. 1. Next, at step 82, a verification of the function and proper set-up of tester 1 is performed. At step 83, base line measurements such as measurement 110 of FIG. 5A are taken, followed at step 84 by a full array of closely related time and voltage readings, providing a matrix similar to matrix 50 of FIG. 5A. At step 86, matrix 50 is smoothed as explained above, providing a modified, stair-stepped matrix similar to matrix 51 illustrated in FIG. 5B. Next, at step 88, the "round-trip" tester delay is calculated via linear interpolation as explained above with reference to FIG. 5C.

At step 90, the method of the invention is applied to the input voltage, similarly to the method used for the output voltage. In this embodiment, the low level of the input voltage $V_{IL}$ and the high level of the input voltage $V_{IH}$ are calculated via linear extrapolation to fit the edge time resolution of the signal driver. In another embodiment, the input signal is simply generated at the unmodified desired voltage levels at the closest available edge points.

Next, at step 92, a $V_{OUT}$ flag is reset (initialized), indicating that the linear extrapolation has not yet been performed. At step 93, contact tests, gross functional tests, and other well-known integrated circuit tests are executed. The TPD test sub-flow then commences as at step 94, as illustrated in detail in FIG. 9.

As shown in FIG. 9, if the $V_{OUT}$ flag is reset (step 91), output slope b is calculated at step 95, and the appropriate test values (e.g., points $O_1$ and $O_2$ in FIG. 7) are calculated based upon the derived slope. In one embodiment, a "sanity check" is provided at step 96 to confirm that the direction (high to low or low to high) of slope b was properly calculated and that the slope of the edge is somewhere near that anticipated for the DUT. If so, the $V_{OUT}$ flag is set at step 97, indicating that the linear extrapolation is completed and should not be repeated for the subsequent devices. At step 98, the novel, highly accurate TPD test provided by the method of the present invention is executed, utilizing the calculated values for $V_{OL}$, $V_{IL}$, and $V_{IH}$, executed at a strobe value dictated by the available strobe resolution. Returning to FIG. 8, at step 99 the remaining AC and parametric tests are executed, and the tested devices are appropriately binned (i.e., graded) according to measured performance. Finally, steps 93, 94, and 99 are repeated for additional devices in a given lot of devices.

It should therefore be understood that the present invention provides both a method of increasing TDR accuracy using linear interpolation of data matrices, and a method of increasing TPD measurement accuracy via linear extrapolation of the derived slope of a linearly interpolated TPD data line. The scope of the present invention should therefore not be constrained by any of the particular or preferred details provided above, and should, instead, be limited only by the following claims.

What is claimed is:

1. A method of measuring electronic signal propagation delay for a given voltage level on an integrated circuit device, the method comprising the steps of:

measuring a first voltage signal at a first time at a first location and the first voltage signal at a second time at a second location;

calculating a first propagation delay for the first voltage level on the device from the time elapsed between the first and second times;

measuring a second voltage signal at a third location at a third time and the second voltage signal at a fourth location at a fourth time;

calculating a second propagation delay for the second voltage level on the device from the time elapsed between the third and fourth times;

calculating a slope on a time vs. voltage plot for the device, based on the first and second calculated propagation delays and the first and second voltage levels;

establishing a desired test point for the device, the desired test point comprising a desired signal propagation delay;

calculating, via linear extrapolation of the desired test point and the calculated slope, a third voltage level corresponding to a first strobe time;

testing the device at the first strobe time by measuring the propagation of a test voltage signal at the third voltage level; and failing the device at the first strobe time in a manner dependent upon the propagation delay of the test voltage signal at the third voltage level.

2. The method of claim 1, further comprising the steps of:

calculating, via linear extrapolation of the desired test point and the calculated slope, a fourth voltage level corresponding to a second strobe time, the first and second strobe times being at either side of the desired test point;

testing the device at the second strobe time by measuring the propagation of a test voltage signal at the fourth voltage level; and failing the device at the second strobe time in a manner dependent upon the propagation delay of the test voltage signal at the fourth voltage level.

3. The method of claim 1, wherein the slope is calculated using the quotient of a difference between the first and second voltage levels and a difference between the first and second propagation delays.

\* \* \* \* \*